United States Patent [19]

Motomura et al.

[11] Patent Number: 5,737,833
[45] Date of Patent: Apr. 14, 1998

[54] METHOD OF PRODUCING A HIGH-DENSITY PRINTED WIRING BOARD FOR MOUNTING

[75] Inventors: Tomohisa Motomura; Osamu Shimada, both of Tokyo; Yoshitaka Fukuoka, Kawasaki, all of Japan

[73] Assignee: Kabushiki Kaisha Toshiba, Kawasaki, Japan

[21] Appl. No.: 539,655

[22] Filed: Oct. 5, 1995

[30] Foreign Application Priority Data

Oct. 7, 1994 [JP] Japan ................................. 6-244459

[51] Int. Cl.$^6$ ................................................ H05K 3/36
[52] U.S. Cl. ........................ 29/830; 29/845; 174/52.2; 174/267
[58] Field of Search .................... 29/830, 846, 842, 29/845; 174/52.2, 267

[56] References Cited

U.S. PATENT DOCUMENTS

| | | | |
|---|---|---|---|
| 4,788,767 | 12/1988 | Desai et al. | 29/830 |
| 4,813,128 | 3/1989 | Massopust | 29/830 |
| 4,991,285 | 2/1991 | Shaheen et al. | 29/830 |
| 5,259,110 | 11/1993 | Bross et al. | 29/830 |
| 5,432,999 | 7/1995 | Capps et al. | 29/830 |
| 5,457,881 | 10/1995 | Schmidt | 29/830 X |

FOREIGN PATENT DOCUMENTS 5-299801  11/1993  Japan ................................. 29/830

*Primary Examiner*—Carl J. Arbes
*Attorney, Agent, or Firm*—Finnegan, Henderson, Farabow, Garrett & Dunner, L.L.P.

[57] ABSTRACT

A method of producing a high-density wiring board for mounting comprises the steps of providing an electroconductive metallic film on the main surface thereof with a photosensitive resist layer, subjecting the photosensitive resist layer to selective exposure to light and development thereby forming holes for selectively exposing the surface of the electroconductive metallic foil in the photosensitive resist layer, depositing an electroconductive metal by plating on the exposed surface of the electroconductive metallic foil thereby forming electroconductive bumps thereon, peeling off the remainder of the photosensitive resist layer, superposing an insulating polymer sheet on the electroconductive bump forming surface, pressing the resultant superposed layers so that the electroconductive bumps to pierce the polymer sheet in the direction of thickness thereof and allowing the leading end parts of the electroconductive bumps to emerge from the polymer sheet and give rise to connecting terminal parts, and selectively etching off the electroconductive metallic foil thereby forming a wiring pattern.

3 Claims, 6 Drawing Sheets

METHOD OF PRODUCING A HIGH-DENSITY PRINTED WIRING BOARD FOR MOUNTING

BACKGROUND OF THE INVENTION

1. Field of the Invention

This invention relates to a method of producing a high-density of wiring board for mounting electronic devices, and more particularly to a method of producing a wiring board having the terminal parts of a wiring pattern for connection to the input and output terminals of electronic devices to be mounted thereon.

2. Description of the Related Art

The mounting circuit devices which have various electronic devices such as a semiconductor element mounted on a wiring board have been finding extensive utility in circuit components of electronic devices. The construction of mounting circuit devices of this kind demands densification or compaction of circuits. For the sake of meeting this demand, the so-called multilayer type wiring boards have come to be used. More specifically, the electronic circuits such as of a computer, for example, have come to be provided with high-density packaging means capable of shortening wirings for the purpose of allowing quick propagation of signals among semiconductor elements. In short, the demand for densification of circuits is met by mounting semiconductor elements in the form of bare chips thereby reducing the relevant areas necessary for mounting and using wiring boards of a small wiring width thereby increasing the packaging density and, at the same time, reducing the length of wirings.

Incidentally, the multilayer type wiring board mentioned above is generally manufactured by means of following procedures. Wiring patterns are formed severally on copper foils which are applied one each to the opposite surfaces of an insulating substrate, then other copper foils are superposed in place through an insulating sheet (such as, for example, a prepreg layer) on the surfaces now bearing the wiring patterns, and all the superposed layers are laminated into one piece by simultaneous application of heat and pressure. Then, the produced laminate is perforated as prescribed by means of drilling, for example, and the inner wall surfaces defining the holes are coated with a metallic layer by the chemical plating technique and the metallic layers in the holes are thickened by electroplating to effect electrical connection between the wiring layers of the inner-layer wiring pattern and the outer-layer wiring pattern. Thereafter, wiring patterns including terminal parts (connecting pads) are formed on the surface copper foils to complete a multilayer wiring board. When the multilayer type wiring board happens to be using wiring pattern layers copiously, it is manufactured by a method which resides in allowing addition to the number of double-faced type wiring boards to be interposed between the opposite surface wiring boards.

As a multilayer type wiring board which is different in construction from that described above, a wiring board which is manufactured by first superposing thin film multi-layer wiring layers using an intervening insulating layer of a polyimide type resin one each on the opposite surfaces of a wiring substrate using an intervening insulating layer of a ceramic substance and then laminating the superposed layers into one piece has been proposed for mounting. When semiconductor elements (LSI) are mounted in their original form of bare chips on the multilayer type printed wiring board manufactured by the procedure described above for the purpose of attaining high-density packaging, the bare chips are provided on the input and output terminal sides thereof with bumps of solder and are connected through the medium of these solder bumps to the terminal parts (pads) on the surface of the multilayer type printed wiring board.

The means for mounting the bare chips through the medium of the solder bumps mentioned above, however, demands that the solder bumps have a minute size conforming to the size of the input and output terminals of the bare chips being mounted and, therefore, is at a disadvantage in not only complicating the formation of the solder bumps but also imposing a handicap on the yield on account of the shape, size, position, and accuracy of the solder bumps. Meanwhile, the wiring board, for the sake of meeting the demand for densification of packaging, requires not only the wiring width to be decreased but also the terminal parts (pads) for connection of the input and output terminals of the bare chips to be miniaturized or the intervals between the terminal parts (pads) to be narrowed.

Further, in this multilayer type wiring board, the through holes interconnecting the wiring patterns have their diameter automatically limited in the light of the improvement of the wiring density mentioned above and the improvement of packaging density. When the through holes have their diameter set in the neighborhood of 0.01 mm, for example, since the manufacture of these through holes defies effective use of an NC drill machine, a new machining device or machining means must be prepared for the perforation.

In any event, the multilayer type wiring board of the construction heretofore known in the art incurs various problems from the viewpoint of densification and compaction of mounting circuit devices.

SUMMARY OF THE INVENTION

This invention, produced for the purpose of coping with the true state of affairs mentioned above, has for an object thereof the provision of a method of producing a high-density wirings of high reliability and a wiring board for high-density packaging.

The first method of this invention for the production of a wiring board for mounting electronic devices is characterized by comprising a step of disposing a photosensitive resist layer on a main surface of an electroconductive metallic foil, a step of subjecting the photosensitive resist layer to selective exposure and development thereby forming holes for selectively exposing the surface of the electroconductive metallic foil to the ambience, a step of plating the exposed surface of the electroconductive metallic foil with an electroconductive metal thereby forming electroconductive bumps thereon, a step of peeling the remaining photosensitive resist layer off the surface on which the electroconductive bumps have been formed, a step of superposing a polymer type sheet on the surface of the electroconductive metallic foil on which the electroconductive bumps have been formed, a step of pressing the superposed layers thereby causing the leading end parts of the electroconductive bumps to pierce the polymer sheet in the direction of thickness thereof and emerge therefrom and, as a consequence, forming connecting terminal parts, and a step of selectively etching and removing the electroconductive metallic foil thereby forming a wiring pattern.

The second method of this invention for the production of a wiring board for mounting is characterized by comprising a step of disposing a photosensitive resist layer on the surface of a wiring board with a wiring pattern, subjecting the photosensitive resist layer to selective exposure and development thereby forming in the photosensitive resist layer such holes as permit growth of bumps therethrough and allow selective exposure of the wiring pattern surface to the ambience, and plating the exposed wiring pattern surface with an electroconductive metal thereby causing growth of electroconductive bumps, a step of peeling off the remainder of the photosensitive resist layer, a step of superposing an insulating polymer sheet on the surface forming the electroconductive bumps, and a step of pressing the superposed layers thereby causing the leading end parts of the electroconductive bumps to pierce the insulating polymer sheet in the direction of thickness thereof and emerge therefrom and consequently forming connecting terminal parts.

In the method of production mentioned above, the surfaces of the connecting terminal parts which have pierced the polymer sheet and emerge therefrom in consequence of the pressure of the superposed layers is preferably coated with a plating layer of a metal of low contact resistance.

The third method of this invention for the production of wiring board for mounting is characterized by comprising the steps of disposing a photosensitive resist layer on a surface of a wiring board with a wiring pattern, selectively exposing and developing the photosensitive resist layer thereby forming in the photosensitive resist layer holes which have selective exposed wiring pattern surfaces and permit growth of bumps therethrough, plating the exposed wiring pattern surfaces with an electroconductive metal to form the electroconductive bumps, removing the remainder of the photosensitive resist layer, and disposing a fluid insulating polymer on the surface forming the electroconductive bumps. In the third aspect of the present invention, the electroconductive bumps are aligned with connecting terminal parts of bare chips, and then heated and pressed to form a mounting wiring board.

In this invention, the electroconductive bumps are formed by selectively depositing such an electroconductive metal as copper by plating. As the masking material for this selective plating, a photosensitive resin is selected for the purpose of enabling minute electroconductive bumps to be readily formed highly accurately with a minute pitch. The disposition of this photosensitive resin is implemented as by applying this resin in the form of a photosensitive film to a relevant surface or by applying the resin in the form of a photosensitive resin solution to the surface and drying the applied resin solution.

Further, the electroconductive bumps which are produced by plating of the electroconductive metal mentioned above in the form of projections (such as, for example, cones or pillars) are determined by the thickness of a mask to be formed by the photosensitive resin, the diameter of holes to be formed in the mask, and the distribution of the holes in the mark. They are, therefore, set properly so as to suit the construction in which the through type terminal parts (pads) and the connecting parts interjoining the wiring pattern layers are to be formed.

As one example of the material for the polymer sheet which the leading end parts of the electroconductive bumps of the form of projections pierce to give rise to the terminal parts and the interlayer connecting parts, a thermoplastic resin film (sheet) may be cited. Appropriately, the thickness of this resin film is in the approximate range of from 25 to 300 μm. As concrete examples of the thermoplastic resin sheet, the sheets of polycarbonate resin, polysulfone resin, thermoplastic polyimide resin, polytetrafluoethylene resin, polypropylene hexa-fluoride resin, and polyether ether ketone resin may be cited. As concrete examples of the thermosetting resin sheet which is used in a state before final hardening, the sheets of epoxy resin, bis-maleimide triazine resin, polyimide resin, phenol resin, polyester resin, and melamine resin, and such raw rubbers as butadiene rubber, butyl rubber, natural rubber, neoprene rubber, and silicone rubber may be cited. Though these polymers are usable by themselves, they may incorporate therein an insulating inorganic or organic filler or may be used in the form of a sheet joined to a reinforcing material such as glass cloth, mat, or paper.

For the purpose of causing the leading end parts of the electroconductive bumps to pierce the polymer sheet and emerge from the surface thereof and give rise to the terminal parts (pads), it is desirable to adopt the following procedure. The polymer sheet is superposed on the substrate in such a manner that the main surface of the polymer sheet borders on the surface of the substrate having deposited thereon the electroconductive bumps of the form of projections, metallic sheets such as stainless steel sheets or brass sheets or hard heat-resistant resin sheets such as polyimide resin sheets or polytetrafluoroethylene resin sheets which suffer only sparing change in size or shape are disposed as holder plates one each against the outermost sides of the superposed layers, and all the superposed layers are pressed so that the leading end sides of the electroconductive bumps in the projected form pierce completely the polymer sheet in the direction of thickness.

As one example of the material for the fluid insulating polymer in the third aspect of the method of the present invention, any insulating polymer materials having fluidity at a room temperature may be used. Epoxy resin type compounds are preferably used. As concrete examples, DBN 515S and DBN 510STD of KYUSHU MATSUSHITA Co. and XS8402 and XS8401 of HOKURIKU TORYO Co. were selected in view of viscosity thereof.

In accordance with the method of this invention for the production of a wiring board for mounting, the terminal parts (pads) to be electrically connected to the input and output terminals of an electronic device to be mounted are formed by being selectively grown owing to the so-called plating technique and making use of the leading end parts of the electroconductive bumps which have pierced an insulating layer. In short, the terminal parts (pads) are constructed by causing the leading end parts of the electroconductive bumps to plunge into the polymer sheet and eventually emerge from the surface of the wiring board and, therefore, can be formed in highly accurate size and shape (the tolerance of dispersion in height about ±2 μm) at a pitch of not more than about 300 μm (in the neighborhood of 100 μm, for example). Since the electroconductive bumps can be formed in a fine shape at a fine pitch as mentioned above, the wiring board which is consequently produced enjoys improvement in both wiring density and packaging density. Moreover, since no through hole is present in the surface of the wiring board, at least the otherwise inevitable decrease in the area for wiring and the area for mounting can be eliminated and the improvement in the wiring density and the packaging density mentioned above can be further enhanced. Thus, the packaging grade wiring board can be endowed with high reliability and can be provided with a high yield.

BRIEF DESCRIPTION OF THE DRAWINGS

FIG. 1A is a cross section showing the state of selective exposure to light of a photosensitive resin layer provided on the surface of a copper foil;

FIG. 1B a cross section showing the state assumed after development;

FIG. 1C a cross section showing the state of growth of projected electroconductive bumps attained by a plating treatment performed on the exposed surface of the copper foil; and FIG. 1D a cross section showing the state assumed after the photosensitive resin layer has been peeled off.

FIG. 2A is a cross section showing the state having a polymer sheet disposed on the surface of a copper foil having deposited thereon projected electroconductive bumps, FIG. 2B a cross section showing the state having a polymer sheet pierced with the leading end parts of the electroconductive bumps, and FIG. 2C a cross section showing the state of the copper foil endowed with a wiring pattern.

FIG. 3A is a cross section showing the essential part of the construction and

FIG. 3B a plan view showing the essential part.

FIG. 4A is a cross section showing the state of growth of projected electroconductive bumps attained by a plating treatment performed on the exposed surface of the copper foil, FIG. 4B a cross section of a wiring board for mounting, and FIG. 4C a cross section showing the state having LSI bare chips mounted on the wiring board.

FIG. 5A is a cross section of superposed layers in which the leading end parts of electroconductive bumps, after piercing a polymer sheet layer, are electrically connected to the opposed surface of an electrolytic copper foil, FIG. 5B a cross section of the essential part of the construction in which projected bumps are formed of electroconductive paste and these projected bumps interconnect wiring layers, and FIG. 5C a cross section of the essential part of a multilayer type wiring board obtained by superposing the superposed wiring board shown in FIG. 5B and the wiring board shown in FIG. 4B and laminating them.

FIG. 6A is a cross section showing the state of growth of projected electroconductive bumps attained by a plating treatment performed on the exposed surface of the copper foil, FIG. 6B a cross section showing the state having a polymer sheet disposed on the surface of a copper foil having deposited thereon projected electroconductive bumps, and FIG. 6C a cross section showing the state of the copper foil endowed with a wiring pattern.

FIG. 7A is a cross section of a wiring board having a wiring pattern.

FIG. 7B is a cross section of the wiring board with a photosensitive resist layer having holes.

FIG. 7C is a cross section of the wiring board with bumps formed by plating.

FIG. 7D is a cross section of the wiring board mounting a bare chip.

DESCRIPTION OF THE PREFERRED EMBODIMENTS

Figure 1A:
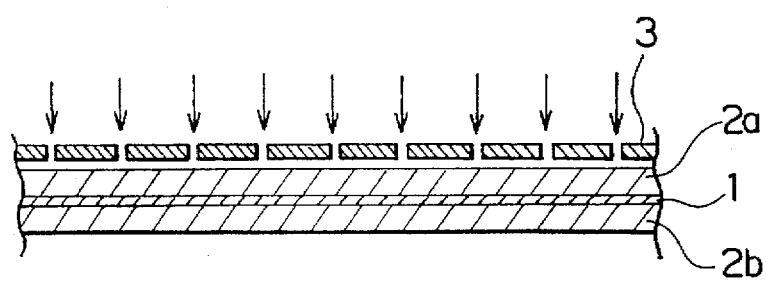
FIG. 1A, FIG. 1B, FIG. 1C, and FIG. 1D are model diagrams showing one example of the method of this invention for the production of a wiring board for mounting.
Figure 1B:
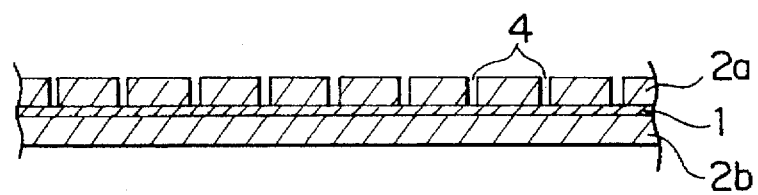
Figure 1C:
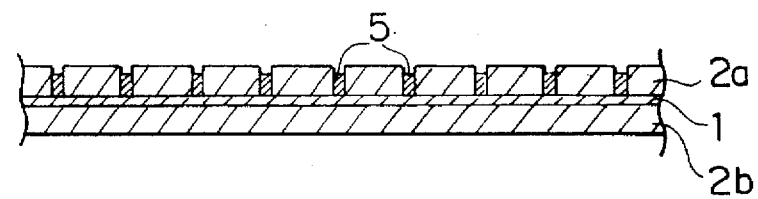
Figure 1D:
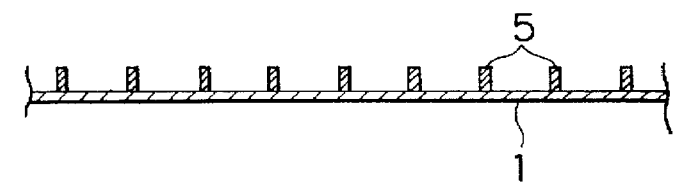

Now, embodiments of this invention will be described below with reference to the accompanying drawings.

Embodiment 1

FIG. 1A, FIG. 1B, FIG. 1C, FIG. 1D, FIG. 2A, FIG. 2B, and FIG. 2C are model diagrams showing an example of the manner of implementing the method of this invention for the production of a wiring board for mounting.

First, an electrolytic copper foil 18 μm in thickness in popular use for the manufacture of a printed wiring board and a photosensitive resin film 150 μm in thickness (produced by Hitachi Chemical Co., Ltd. and marketed under trademark designation of "Photec SR-3000EB-22") were prepared. Then, as shown cross-sectionally in FIG. 1A, two sheets 2a and 2b of the photosensitive resin film (photosensitive resist) mentioned above were adhered one each to the opposite surfaces of the electrolytic copper foil 1 mentioned above. Subsequently, the photosensitive resist film 2a was exposed through a mask 3 to light (selective exposure). The photosensitive resist film 2a which had undergone the selective exposure mentioned above was given a developing treatment to form holes 4 of a diameter of 75 μm in the photosensitive resist film 2a as cross-sectionally shown in FIG. 1B.

Thereafter, the resultant composite layer was so immersed in an electric copper plating liquid (produced by Japan Energy K. K. and marketed under product code of "KC500") as to utilize the electrolytic copper foil 1 as a cathode therein and subjected to an electric copper plating treatment therein to induce growth of copper to a height of about 130 μm inside the holes 4 (on the selectively exposed surface of the electrolytic copper foil 1) in the photosensitive resist film 2a as cross-sectionally shown in FIG. 1C. After the plating treatment was completed, the photosensitive resist films 2a and 2b which had functioned as masks were peeled off to give rise to a group of projected electroconductive bumps 5 on the main surface of the electrolytic copper foil 1 as cross-sectionally shown in FIG. 1D.

Then, on the surface of the electrolytic copper foil 1 on which the group of projected electroconductive bumps 5 were formed, a polymer sheet 6 of a thickness of 50 μm such as, for example, a composite sheet comprising Teflon (tetrafloroethylene) resin-glass cloth type prepreg, and an aluminum foil and a kraft paper (neither shown in the drawing) were superposed. The superposed layers were set in place between hot plates of a hot-press kept at 180° C. and pressed therein under a pressure of about 1.96×10⁶ Pa for 15 minutes to produce a laminated sheet in which the leading end parts of the electroconductive bumps 5 pierced the polymer sheet 6 layer and emerged from the other surface thereof as cross-sectionally shown in FIG. 2B.

Subsequently, etching resist was deposited by printing on the electrolytic copper foil 1 surface of the laminated sheet. The electrolytic copper foil 1 was selectively etched by means of the etching resist to form a wiring pattern 7 thereon and the etching resist was peeled off with an aqueous alkali solution to produce a wiring board for mounting 8 as cross-sectionally shown in FIG. 2C.

Figure 2A:
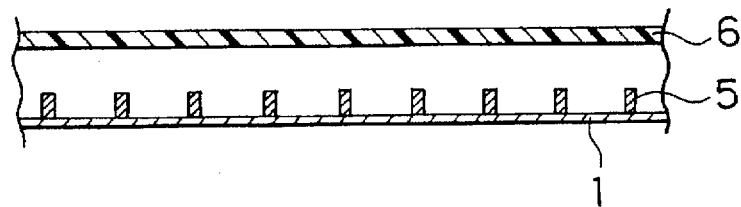
FIG. 2A, FIG. 2B, and FIG. 2C are model diagrams showing another example of the method of this invention for the production of a wiring board for mounting.
Figure 2B:
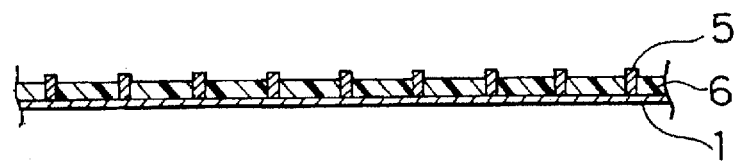
Figure 2C:
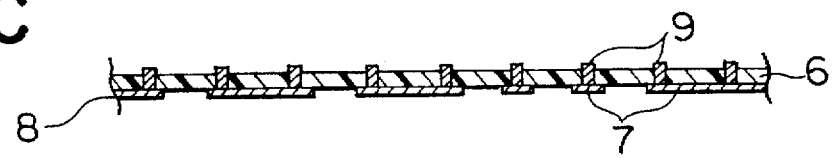
Figure 3A:
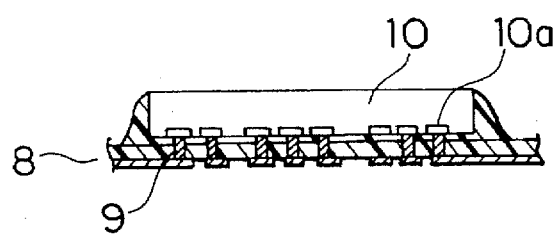
FIG. 3A and FIG. 3B are model diagrams showing one example of the manner in which LSI bare chips are mounted on a wiring board according to this invention.
Figure 3B:
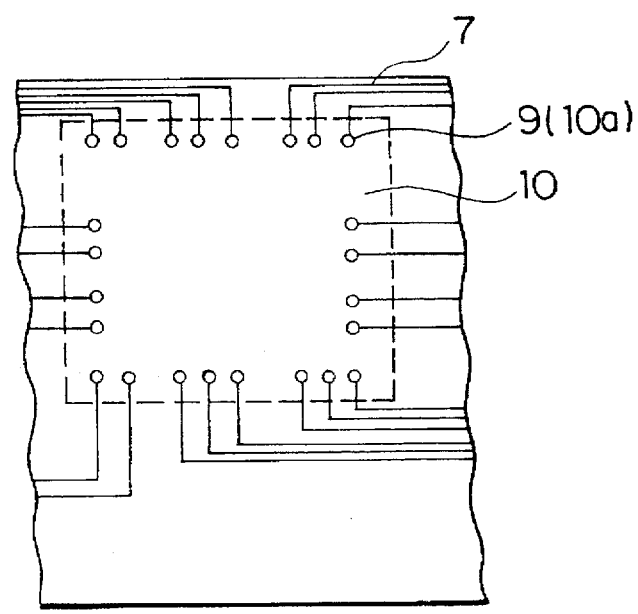

The wiring board 8 mentioned above was so constructed that the leading end parts of the electroconductive bumps 5 were exposed as terminal parts (pads) 9 through one of the main surfaces (front surface) and the wiring pattern 7 for connection with the terminal parts 9 was formed on the other main surface (rear surface) as shown cross-sectionally in FIG. 2C. The terminal parts 9 mentioned above were set at prescribed positions and opposed and connected infallibly to input and output terminals 10a of an LSI (semiconductor) bare chip 10 and electrically connected stably by an intermetallic junction (inclusive of a junction between metals and a junction of metals at normal room temperature) as shown cross-sectionally in FIG. 3A and planarly perspectively in FIG. 3B.

Embodiment 2

Figure 4A:
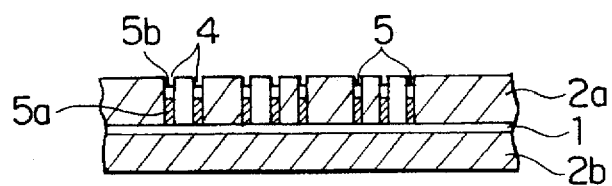
FIG. 4A, FIG. 4B, and FIG. 4C are model diagrams showing another manner of implementing the method of this invention for the production of a wiring board for mounting.
Figure 4B:
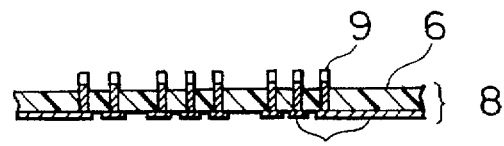
Figure 4C:
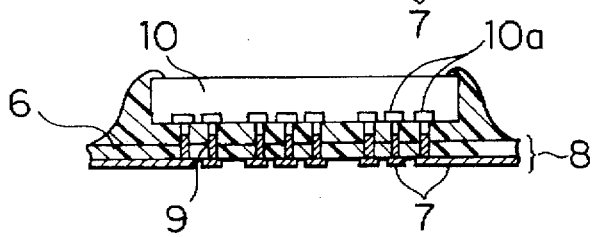

FIG. 4A, FIG. 4B, and FIG. 4C are model diagrams showing another manner of implementing the method of this invention for the production of a packaging wiring board.

First, an electrolytic copper foil 18 µm in thickness in popular use for the manufacture of a printed wiring board and a photosensitive resin film 150 µm in thickness (produced by Hitachi Chemical Co., Ltd. and marketed under trademark designation of "Photec SR-3000EB-22") were prepared. Then, two sheets 2a and 2b of the photosensitive resin film (photosensitive resist) mentioned above were adhered one each to the opposite surfaces of the electrolytic copper foil 1 mentioned above. Subsequently, the photosensitive resist film 2a was exposed through a mask 3 to light (selective exposure). The photosensitive resist film 2a which had undergone the selective exposure mentioned above was given a developing treatment to form holes 4 of a diameter of 75 µm in the photosensitive resist film 2a.

Thereafter, the resultant composite layer was so immersed in an electric copper plating liquid (produced by Japan Energy K. K. and marketed under product code of "KC500") as to utilize the electrolytic copper foil 1 as a cathode therein and subjected sequentially to an electric copper plating treatment and a gold plating treatment therein to induce growth of copper 5a to a height of about 130 µm and growth thereon of gold 5b to a height of about 15 µm inside the holes 4 (on the selectively exposed surface of the electrolytic copper foil 1) in the photosensitive resist film 2a as cross-sectionally shown in FIG. 4A. After the plating treatment was completed, the photosensitive resist films 2a and 2b which had functioned as masks were peeled off to form on one main surface of the electrolytic copper foil 1 a group of projected electroconductive bumps 5 each having the copper 5a and the gold 5b superposed therein.

Then, on the surface of the electrolytic copper foil 1 on which the group of projected electroconductive bumps 5 were formed, a polymer sheet 6 of a thickness of 50 µm such as, for example, a composite sheet comprising Teflon resin-glass cloth type prepreg, and an aluminum foil and a kraft paper (neither shown in the drawing) were superposed. The superposed layers were set in place between hot plates of a hot-press kept at 180° C. and pressed therein under a pressure of about 1.96×10⁶ Pa for 15 minutes to produce a laminated sheet in which the leading end parts of the electroconductive bumps 5 pierced the polymer sheet 6 layer and emerged from the other surface thereof.

Subsequently, etching resist was deposited by printing on the electrolytic copper foil 1 surface of the laminated sheet. The electrolytic copper foil 1 was selectively etched through the etching resist to form a wiring pattern 7 thereon and the etching resist was peeled off with an aqueous alkali solution to produce a wiring board for mounting 8 as cross-sectionally shown in FIG. 4B.

The wiring board for mounting 8 mentioned above was so constructed .that the leading end parts of the electroconductive bumps 5 were exposed as terminal parts (pads) 9 through one of the main surfaces (front surface) and the wiring pattern 7 for connection with the terminal parts 9 was formed on the other main surface (rear surface) as shown cross-sectionally in FIG. 4B. The terminal parts 9 mentioned above were set at prescribed positions and opposed and connected infallibly to input and output terminals 10a of an LSI (semiconductor) bare chip 10 and electrically connected stably by an intermetallic junction as shown cross-sectionally in FIG. 4C.

Embodiment 3

Figure 5A:
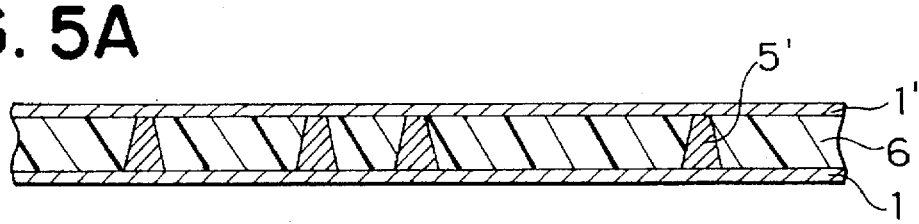
FIG. 5A, FIG. 5B, and FIG. 5C are model diagrams showing yet another manner of implementing the method of this invention for the production of a wiring board for mounting.
Figure 5B:
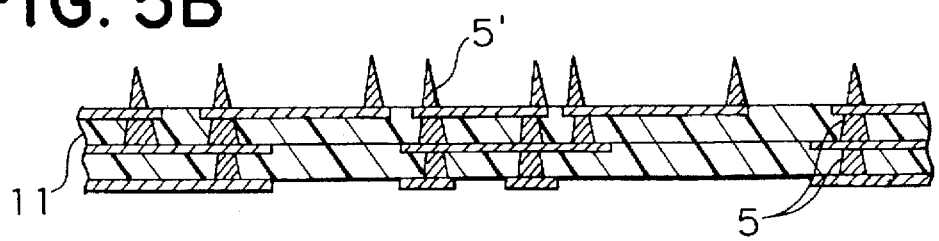
Figure 5C:
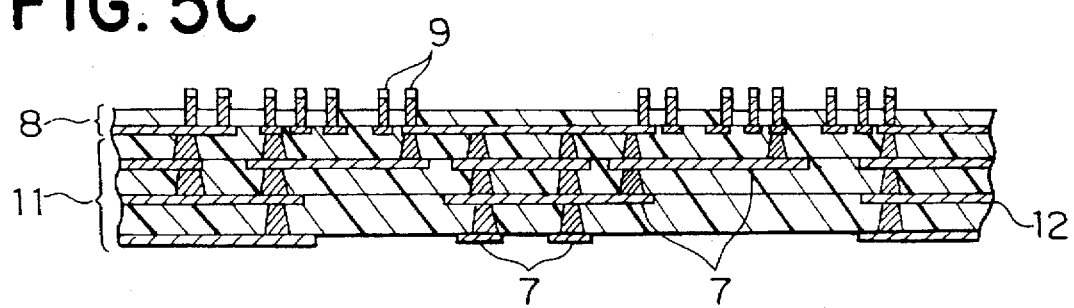

FIG. 5A, FIG. 5B, and FIG. 5C are model diagrams showing another manner of implementing the method of this invention for the production of a wiring board for mounting.

First, an electrolytic copper foil 1 of a thickness of 18 µm in popular use for the production of a printed wiring board, a polymer type silvery paste (produced by Toshiba Chemical K. K. and marketed under trademark designation of "Chemitight MS-89"), and a metal mask produced by perforating holes of a diameter of 0.1 mm at prescribed positions in a stainless steel plate 100 µm in thickness were prepared. Then, the metal mask was set in place on the surface of the electrolytic copper foil 1 and the silvery paste was applied by printing to this surface to deposit thereon projected electroconductive bumps of a practically square cross section at a minimum pitch of about 0.3 mm. After the printed electroconductive bumps were dried, the printing was repeated four times at the same position by the use of the same metal mask to produce ultimately practically conical electroconductive bumps 5' having a height in the range of from 60 to 100 µm.

Then, on the surface of the electrolytic copper foil 1 having the electroconductive bumps formed thereon, the electrolytic copper foil 1' of a thickness of 18 µm was superposed through the medium of a polymer sheet 6 of a thickness of 50 µm such as, for example, a composite sheet comprising Teflon resin-glass cloth type prepreg. The superposed layers were set in place between hot plates of a hot-press kept at 180° C. and pressed therein under a pressure of about 1.96×10⁶ Pa for 15 minutes to produce a laminated sheet in which the leading end parts of the electroconductive bumps 5 pierced the polymer sheet 6 layer and emerged from the other surface thereof as cross-sectionally shown in FIG. 5A.

Thereafter, etching resist was applied by printing to the electrolytic copper foil surface of the laminated sheet, the electrolytic copper foil was selectively etched to form a wiring pattern thereon, and the etching resist was peeled off with an aqueous alkali solution to give rise to a double-faced wiring board. At a prescribed position on one of the wiring pattern surfaces of the double-faced wiring board, electroconductive bumps of the silvery paste were formed by following the procedure described above and the electrolytic copper foil of a thickness of 18 μm was superposed on the electroconductive bumps through the medium of the Teflon resin-glass cloth type prepreg. By repeating this impartation of the wiring pattern to the electrolytic copper foil, a superposed wiring board 11 constructed as cross-sectionally shown in FIG. 5B was produced.

On the electroconductive bump 5' forming surface of the superposed wiring board 11 produced as described above, the wiring board 8 shown in FIG. 4B was superposed through the medium of the Teflon resin-glass cloth type prepreg of a thickness of 50 μm, for example. The resultant laminated sheet was set in place between hot plates of a hot-press kept at 180° C. and pressed therein under a pressure of about $1.96 \times 10^6$ Pa for 15 minutes to produce a multilayer type wiring board 12 in which the leading end parts of the electroconductive bumps 5' pierced the polymer sheet 6 layer and came to be electrically connected to the wiring pattern 7 of the wiring board 8 and, at the same time, the wiring board 8 and the superposed wiring board 11 were laminated [as shown in FIG. 5C].

The multilayer type packaging grade wiring board 12 was so constructed that the leading end parts of the electroconductive bumps 5 emerged as terminal parts (pads) 9 from one main surface (front surface) thereof. Since the terminal parts (pads) 9 mentioned above were accurately disposed at prescribed positions and, therefore, were infallibly joined to the input and output terminals of an LSI (semiconductor) bare chip, for example, the electrical connection was stably attained by union between metals.

Embodiment 4

Figure 6A:
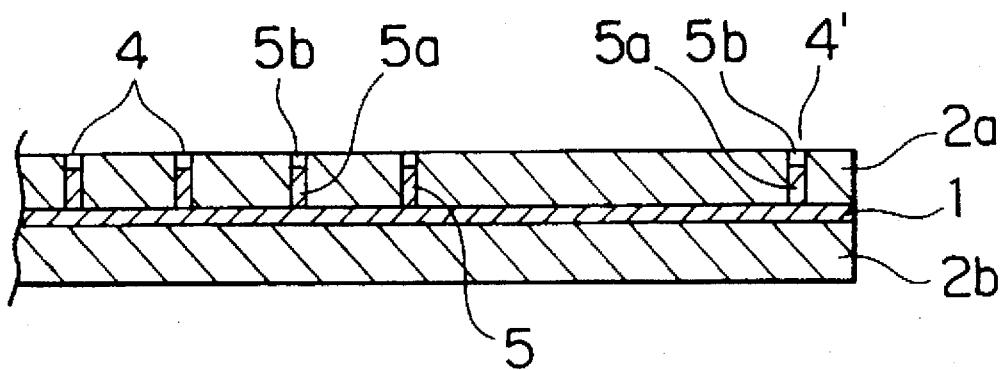
FIG. 6A, FIG. 6B, and FIG. 6C are model diagrams showing yet another example of the method of this invention for the production of a wiring board for mounting according to this invention.
Figure 6B:
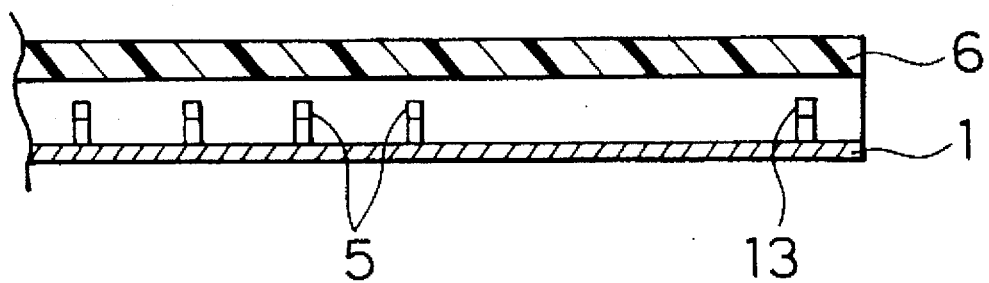
Figure 6C:
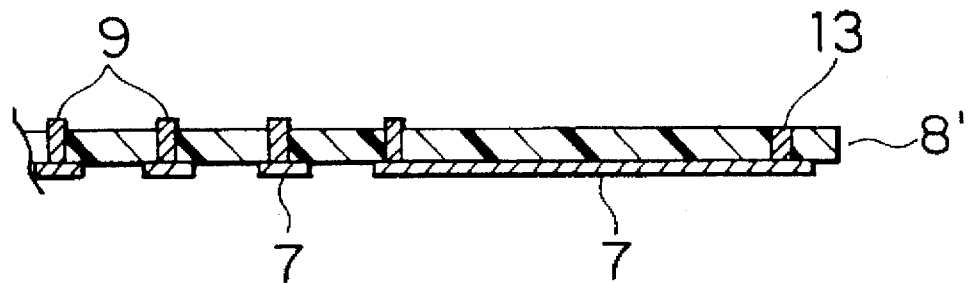

FIG. 6A, FIG. 6B, and FIG. 6C are model diagrams showing this example of the method for the production of a wiring board for mounting.

First, an electrolytic copper foil 18 μm in thickness in popular use for the manufacture of a printed wiring board and a photosensitive resin film 150 μm in thickness (produced by Hitachi Chemical Co., Ltd. and marketed under trademark designation of "Photec SR-3000EB-22") were prepared. Then, two sheets 2a and 2b of the photosensitive resin film (photosensitive resist) mentioned above were adhered one each to the opposite surfaces of the electrolytic copper foil 1 mentioned above. Subsequently, the photosensitive resist film 2a was exposed through a mask to light (selective exposure). This selective exposure was additionally intended to provide the wiring board in the peripheral part thereof with an electroconductive bumps 13 to be used for contact with the probe of a tester.

Then, the photosensitive resist films 2a and 2b which had undergone the selective exposure mentioned above was subjected to a developing treatment to form holes 4 and 4' of a diameter of about 75 μm in the photosensitive resist film 2a.

The composite layer consequently obtained was so immersed in an electric copper plating liquid (produced by Japan Energy K. K. and marketed under product code of "KC500") as to utilize the electrolytic copper foil 1 as a cathode therein and subjected sequentially to an electric copper plating treatment and a gold plating treatment therein to induce growth of copper 5a to a height of about 130 μm and growth thereon of gold 5b to a height of about 15 μm inside the holes 4 (on the selectively exposed surface of the electrolytic copper foil 1) in the photosensitive resist film 2a and further induce growth of copper 5a to a height in the approximate range of from 150 to 200 μm and growth thereon of gold 5b to a height of about 15 μm inside the hole 4' as cross-sectionally shown in FIG. 6A. After the plating treatment was completed, the photosensitive resist films 2a and 2b which had functioned as masks were peeled off to form on one main surface of the electrolytic copper foil 1 a group of projected electroconductive bumps 5 and 13 each having the copper 5a and the gold 5b superposed therein.

Then, a Teflon resin-glass cloth type prepreg 6 of a thickness of 50 μm destined to form a substrate proper was superposed on the surface of the electrolytic copper foil 1 on which the electroconductive bumps 5 and 13 had been formed as cross-sectionally shown in FIG. 6B. The resultant laminated sheet was set in place between hot plates of a hot-press kept at 180° C. and pressed therein under a pressure of about $1.96 \times 10^6$ Pa for 15 minutes to produce a laminated plate in which the leading end parts of the electroconductive bumps 5' and 13 pierced the polymer sheet 6 layer and emerged from the other side thereof.

Of the electroconductive bumps 5 and 13 which had pierced the laminated sheet and emerged from the other side thereof, the electroconductive bumps 13 having a larger height were depressed with a press. Then, etching resist was applied by printing to the electrolytic copper foil surface of the laminated sheet, the electrolytic copper foil was selectively etched to form a wiring pattern thereon, and the etching resist was peeled off with an aqueous alkali solution to obtain a loading grade wiring board 8' as cross-sectionally shown in FIG. 6C.

In the wiring board 8' constructed as described above, a terminal 13' which was electrically connected to the terminal parts 9 destined to contact the input and output terminals of a bare chip to be mounted was led out to the peripheral part. After the bare chip was mounted and packaged, therefore, the terminal 13' led out to the peripheral part allowed the mounted bare chip to be easily tested for conformity in performance. In other words, this terminal 13' enabled the mounted bare chip to be easily and infallibly tested for characteristics without requiring the probe of a tester to contact directly the input and output terminals of the bare chip. Further, the terminal 13' likewise enabled the rating of characteristics by the use of a plurality of probes of tester to be attained, depending on the wiring pattern interconnecting the terminal parts 9 formed of the electroconductive bumps 5 and 13 and the terminal 13'.

Embodiment 5

FIG. 7A, FIG. 7B, FIG. 7C, and FIG. 7D are model diagrams showing the present example of the method for the production of a wiring board for mounting.

Figure 7A:
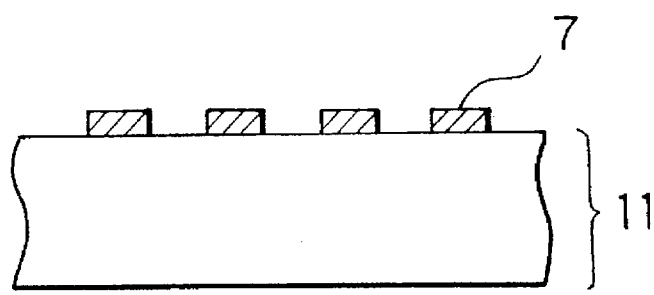
FIG. 7A, FIG. 7B, FIG. 7C, and FIG. 7D are model diagrams showing the manner of implementing the method of the embodiment 5.
Figure 7B:
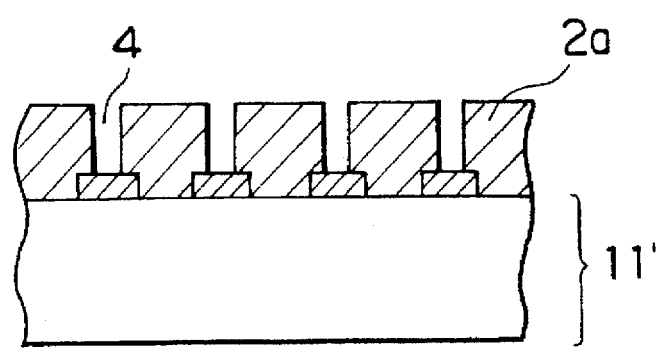
Figure 7C:
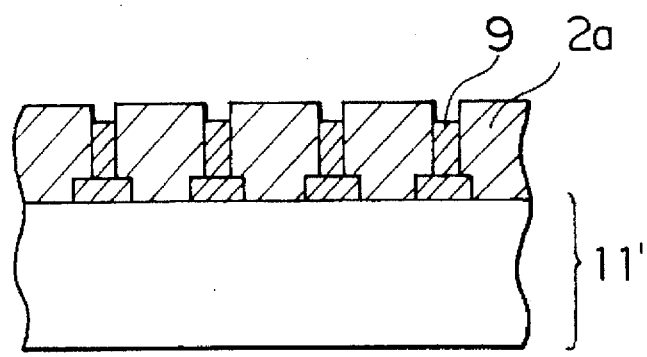
Figure 7D:
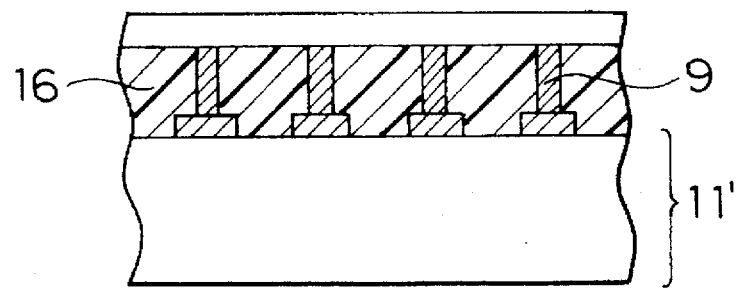
Figure 8:
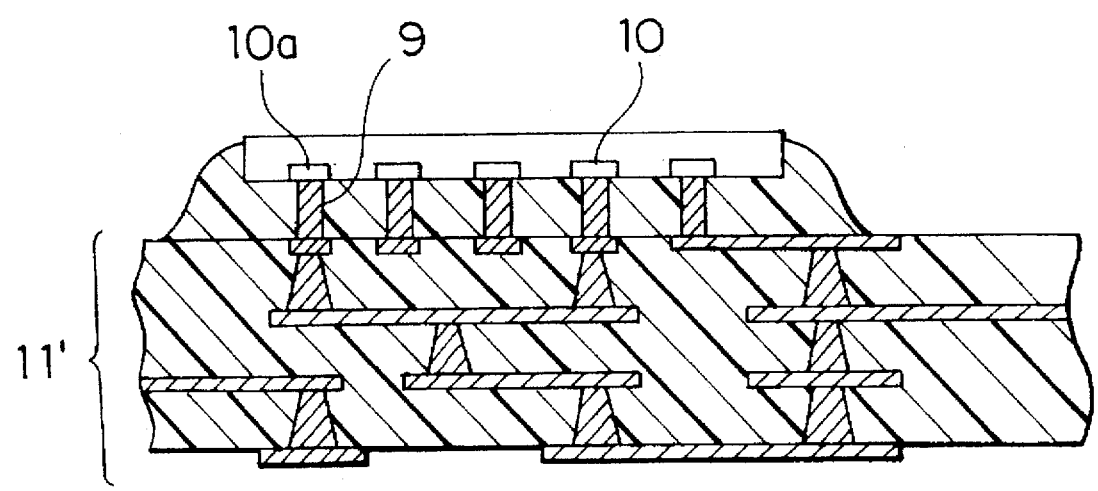
FIG. 8 is a cross section of a multiple layer wiring board with a mounted bare chip according to the embodiment 5.

A photosensitive resist layer 2a was formed on the surface of a wiring board 11' having bearing a wiring pattern 7 (FIG. 7A). It was then provided with holes 4 by the treatments of exposure and development (FIG. 7B). Subsequently, the holes were plated with a metal to form electroconductive bumps 9 (FIG. 7C). The remainder of the photosensitive resist layer 2a was peeled off. On the surface of the wiring pattern having the bumps, a fluid insulating polymer 16 was superposed. The terminals 10a of a bare chip and the bumps were alligned and then treated by simultaneous application of heat and pressure (FIG. 7D) to mount. The bare chip and the bumps were perfectly connected as evinced by the fact that the connection resistance was 0.1 Ω.

Owing to the unnecessariness of using an insulating polymer sheet, the process of production could be simplified and the piercing of bumps could be infallibly attained and, as a result, the pitch of bumps could be amply decreased.

While there have been shown and described preferred embodiments of the invention, it is to be distinctly understood that the invention is not limited thereto but may be otherwise variously embodied and practiced within the scope of the present invention. For example, for the insulating material between the wiring pattern layers, polyimide resin or polysulfone resin may be used in the place of the Teflon resin-glass cloth type prepreg.

As clearly demonstrated by the embodiments cited above, the method of this invention for the production of a wiring board for mounting allows easy manufacture of a wiring board which is provided at prescribed positions accurately with minute terminal parts (pads).

The dispersion of the height of terminal parts is not more than about ±2 µm, the connection resistance at the terminal parts is not more than 0.1 Ω, and these terminal parts can be disposed at a pitch of about 100 µm.

Owing to the exaltation of the accuracy with which the terminal parts are set in place and shaped in the wiring board for mounting, the input and output terminals can be infallibly alligned and connected to a given bare chip. Thus, the present invention permits provision of packaging devices and circuits with high reliability.

Since the terminal parts are led out to the surface in the manner of so-called embedment involving the penetration of electroconductive bumps, the method of this invention not only obviates the necessity for such complicated works as boring of through holes and plating of through holes but also alleviates the restrictions imposed by such through holes on the area for wiring and the area for mounting. Thus the wiring and the mounting can be accomplished with high density.

What is claimed is:

1. A method of producing a high-density wiring board for mounting, comprising the steps of:

disposing a photosensitive resist layer on a main surface of an electroconductive metallic foil;

subjecting said photosensitive resist layer to selective exposure and development thereby forming holes for selectively exposing a surface of said electroconductive metallic foil in said photosensitive resist layer;

depositing an electroconductive metal by plating on said exposed surface of said electroconductive metallic foil to form electroconductive bumps;

peeling off a remaining photosensitive layer on the main surface of the electroconductive metallic foil, superposing a first insulating polymer sheet on a surface forming said electroconductive bumps thereon;

pressing the resultant superposed layers in a direction of thickness thereof so that leading end parts of said electroconductive bumps pierce said first insulating polymer sheet to emerge and form connecting terminal parts;

selectively removing by etching said electroconductive metallic foil thereby forming a first wiring board having a first wiring pattern;

superposing said first wiring board through a second insulating polymer sheet on a second wiring pattern of a second wiring board, said second wiring pattern providing second electroconductive bumps at pre-described positions of said second wiring pattern; and pressing the resultant superposed layers in a direction of thickness thereof so that leading end parts of said second electroconductive bumps pierce said second insulating polymer sheet to connect with said first wiring pattern of said first wiring board.

2. The method according to claim 1, wherein said second wiring board is a multilayer wiring board.

3. The method according to claim 2, wherein a method of producing said second wiring board of said multilayer wiring board comprising:

a first step of disposing a metal mask having holes for electroconductive bumps at prescribed positions thereof on one surface of a first electroconductive metallic foil and depositing said electroconductive bumps by repeating of printing and drying an electroconductive paste on the surface;

a second step of superposing a polymer sheet and a second electroconductive metallic foil sequentially in order on the surface having said electroconductive bumps;

a third step of simultaneously heating and pressing the resultant superposed layers so that leading end parts of said electroconductive bumps pierce said polymer sheet and connect to said second electroconductive metallic foil to form a laminated sheet having a first electroconductive metallic foil surface and a second electroconductive metallic foil surface;

a fourth step of printing an etching resist layer on the first electroconductive metallic foil surface and the second electroconductive metallic foil surface, selectively etching said first and second electroconductive metallic foils to form a wiring pattern, and removing said etching resist layer to form a double-faced type wiring board, and repeating a plurality of times of said first, second, third and fourth steps to form a multilayer wiring board.

* * * * *